(12) United States Patent
Oh

(10) Patent No.: US 9,240,453 B2
(45) Date of Patent: Jan. 19, 2016

(54) DUAL WORK FUNCTION BURIED GATE TYPE TRANSISTOR AND METHOD FOR FABRICATING THE SAME

(71) Applicant: SK hynix Inc., Gyeonggi-do (KR)

(72) Inventor: Tae-Kyung Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/327,197

(22) Filed: Jul. 9, 2014

(65) Prior Publication Data

US 2015/0214314 A1    Jul. 30, 2015

(30) Foreign Application Priority Data

Jan. 29, 2014    (KR) .................. 10-2014-0011570

(51) Int. Cl.
| | | |
|---|---|---|
| H01L 29/423 | (2006.01) | |
| H01L 29/49 | (2006.01) | |
| H01L 29/06 | (2006.01) | |
| H01L 21/311 | (2006.01) | |
| H01L 21/306 | (2006.01) | |
| H01L 21/28 | (2006.01) | |
| H01L 21/3213 | (2006.01) | |
| H01L 29/66 | (2006.01) | |
| H01L 29/78 | (2006.01) | |

(52) U.S. Cl.
CPC ...... *H01L 29/4236* (2013.01); *H01L 21/28035* (2013.01); *H01L 21/28114* (2013.01); *H01L 21/30604* (2013.01); *H01L 21/31111* (2013.01); *H01L 21/32133* (2013.01); *H01L 29/0653* (2013.01); *H01L 29/4941* (2013.01); *H01L 29/66621* (2013.01); *H01L 29/78* (2013.01)

(58) Field of Classification Search
CPC ............... H01L 29/4236; H01L 29/78; H01L 21/28035; H01L 21/32133; H01L 29/4941; H01L 21/28114; H01L 29/66621; H01L 29/0653; H01L 21/30604; H01L 21/31111
See application file for complete search history.

(56) References Cited

U.S. PATENT DOCUMENTS

| | | | | |
|---|---|---|---|---|
| 8,647,972 | B1 * | 2/2014 | Ando | H01L 21/28088 257/E21.294 |
| 2006/0175669 | A1 * | 8/2006 | Kim | H01L 29/4908 257/401 |
| 2008/0111167 | A1 * | 5/2008 | Yamaguchi | H01L 21/28079 257/288 |
| 2012/0061751 | A1 | 3/2012 | Gibbons et al. | |
| 2013/0049069 | A1 | 2/2013 | Zhu et al. | |
| 2013/0161734 | A1 | 6/2013 | Wu | |
| 2013/0299918 | A1 * | 11/2013 | Kim | H01L 29/78 257/402 |

FOREIGN PATENT DOCUMENTS

KR    100620065    9/2006

* cited by examiner

*Primary Examiner* — Ermias Woldegeorgis
(74) *Attorney, Agent, or Firm* — IP & T Group LLP

(57) ABSTRACT

A transistor includes a substrate having an active region defined by an isolation layer; a first trench defined in the active region and a second trench defined in the isolation layer; a fin region formed under the first trench; and a buried gate electrode covering sidewalls of the fin region and filling the first and second trenches. The buried gate electrode includes a first work function layer formed on the sidewalls of the fin region; a second work function layer formed on sidewalls of the first trench and the second trench; a third work function layer positioned over the fin region and contacting the second work function layer; and a low resistance layer contacting the third work function layer and partially filling the first and second trenches.

10 Claims, 15 Drawing Sheets

DUAL WORK FUNCTION BURIED GATE TYPE TRANSISTOR AND METHOD FOR FABRICATING THE SAME

CROSS-REFERENCE TO RELATED APPLICATIONS

The present application claims priority of Korean Patent Application No. 10-2014-0011570, filed on Jan. 29, 2014, which is incorporated herein by reference in its entirety.

BACKGROUND

1. Field

Various exemplary embodiments of the present disclosure relate to a transistor, and more particularly, to a dual work function buried gate type transistor and a method for fabricating the same.

2. Description of the Related Art

A metal gate electrode may be applied as the gate electrode of a transistor. Since a metal gate electrode has low resistance, gate resistance may be decreased. Additionally, since a metal gate electrode may have a high work function, the channel dose may be decreased. Thus, leakage current may be reduced, and the performance of the transistor may be improved.

However, there may be issues caused by the high work function, since gate-induced drain leakage (GIDL) increases where the metal gate electrode and source/drain regions overlap. Particularly, in a buried gate type transistor, since the overlap area between the buried metal gate electrode and source/drain regions is large, gate-induced drain leakage (GIDL) may be an issue.

To reduce gate-induced drain leakage (GIDL), the height of the buried metal gate electrode may be lowered. Accordingly, the overlap area between the buried metal gate electrode and the source/drain regions may be reduced.

However, if the height of the buried metal gate electrode is lowered, there may be a concern that the gate resistance increases and the current drivability of the transistor is degraded.

Hence, an improved trade-off between gate-induced drain leakage (GIDL) and current drivability is in demand.

SUMMARY

Various embodiments of the present invention are directed to a buried gate type transistor and a method for fabricating the same, for reducing gate-induced drain leakage and improving current drivability.

In an embodiment of the present invention, a transistor may include: a substrate having an active region defined by an isolation layer; a first trench defined in the active region and a second trench defined in the isolation layer; a fin region formed under the first trench; and a buried gate electrode covering sidewalls of the fin region and filling the first and second trenches, the buried gate electrode including: a first work function layer formed on the sidewalls of the fin region; a second work function layer formed on sidewalls of the first trench and the second trench; a third work function layer positioned over the fin region and contacting the second work function layer; and a low resistance layer contacting the third work function layer and partially filling the first and second trenches.

In another embodiment of the present invention, a method for fabricating a transistor may include: forming an isolation layer in a substrate to define an active region; etching the isolation layer and the active region to form a trench; recessing the isolation layer in the trench to form a fin region; forming a gate dielectric layer on sidewalls of the trench and on a top surface and sidewalls of the fin region; forming a first conductive layer which lines the gate dielectric layer; selectively removing the first conductive layer to form a first work function layer on the sidewalls of the fin region and a second work function layer on the sidewalls of the trench; forming a second conductive layer over the first work function layer and the second work function layer; forming a low resistance layer which fills the trench, over the second conductive layer; and recessing the second conductive layer, the third work function layer and the second work function layer to form a buried gate electrode.

DETAILED DESCRIPTION

Figure 1:
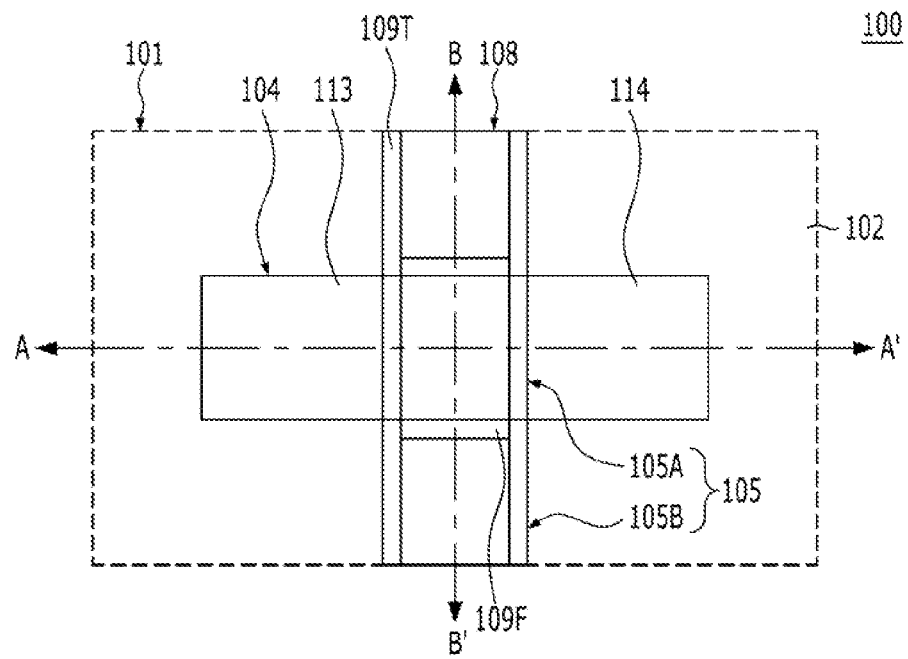
FIG. 1 is a plan view illustrating a transistor in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
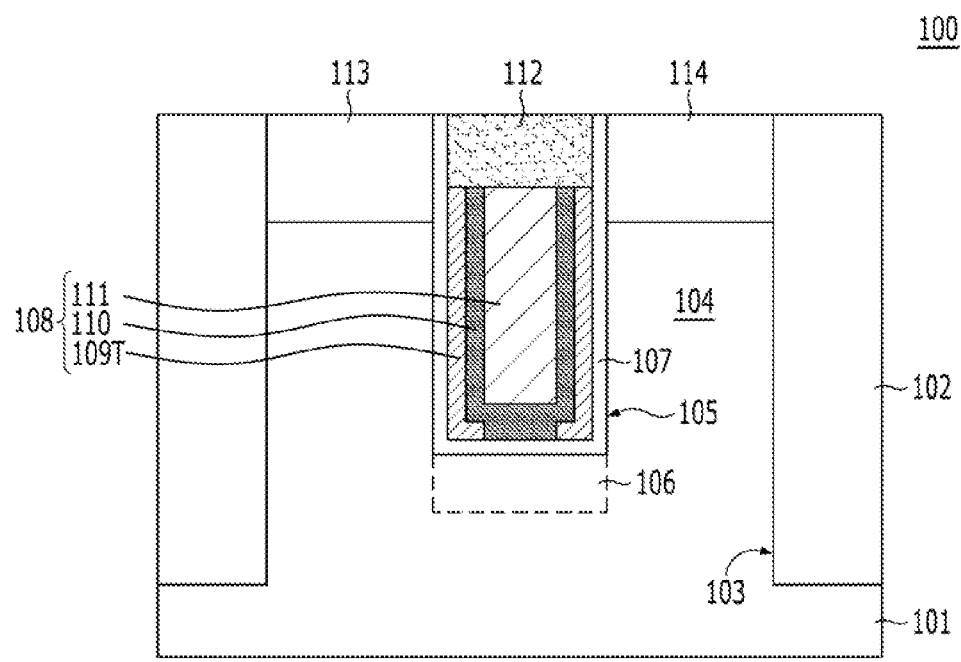
FIGS. 2A and 2B are views illustrating the transistor in accordance with the embodiment of the present invention.
Figure 2B:
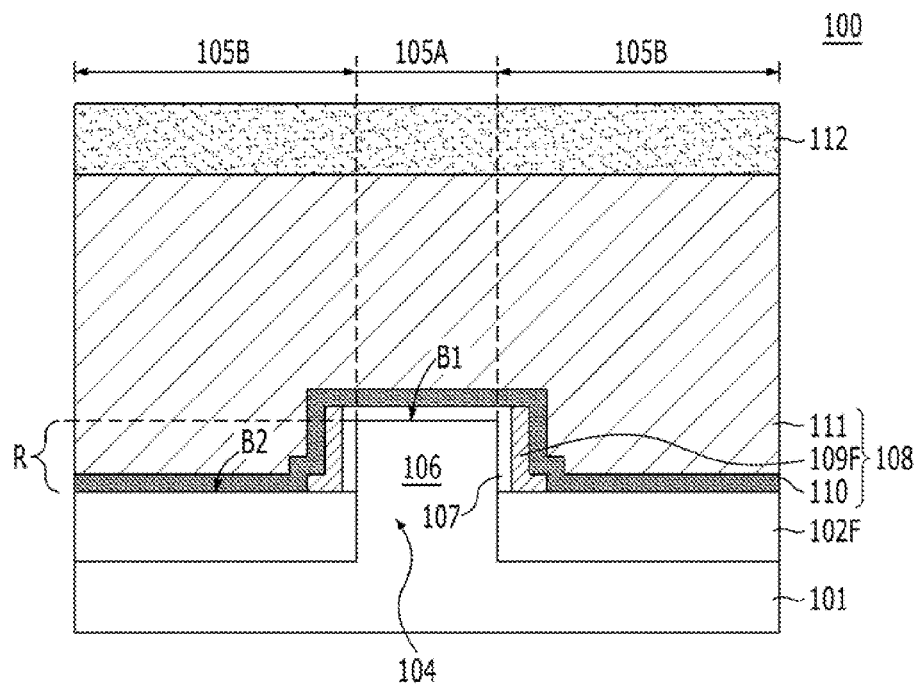

FIG. 1 is a plan view illustrating a transistor in accordance with an embodiment of the present invention. FIG. 2A is a cross-sectional view taken along the line A-A' of FIG. 1. FIG. 2B is a cross-sectional view taken along the line B-B' of FIG. 1.

Referring to FIGS. 1, 2A and 2B, a transistor 100 includes a buried gate electrode 108, a first impurity region 113, and a second impurity region 114. An isolation layer 102 and an active region 104 are formed in a substrate 101. A trench 105 is defined to extend across the active region 104 and the isolation layer 102. The buried gate electrode 108 is formed in the trench 105. The first impurity region 113 and the second impurity region 114 are separated by the trench 105. The trench 105 includes a first trench 105A and a second trench 105B. The first trench 105A is defined in the active region 104. The second trench 105B is defined in the isolation layer 102. The first trench 105A and the second trench 105B may communicate with each other. The buried gate electrode 108 includes a first work function layer 109F and a second work function layer 109T. The first work function layer 109F is positioned on the sidewalls of a fin region 106. The second work function layer 109T is positioned on the sidewalls of the trench 105. The first work function layer 109F and the second work function layer 109T may include a low work function material.

The transistor 100 is formed in the substrate 101. The substrate 101 may include a semiconductor substrate. The substrate 101 may be a silicon substrate. The isolation layer 102 is formed in the substrate 101. The isolation layer 102 is filled in an isolation trench 103. The active region 104 is defined in the substrate 101 by the isolation layer 102.

The trench 105 which has a predetermined depth is defined in the substrate 101. The trench 105 may be a line type which extends in any one direction. The trench 105 has a shape which extends across the active region 104 and the isolation layer 102. The trench 105 has a depth that is shallower than the isolation trench 103. The trench 105 includes the first trench 105A and the second trench 105B. The first trench 105A is defined in the active region 104. The second trench 105B is defined in the isolation layer 102. The first trench 105A and the second trench 105B may communicate with each other. The first trench 105A and the second trench 105B may have bottom surfaces which are positioned at different levels. For example, a bottom surface B1 of the first trench 105A may be positioned at a higher level than a bottom surface B2 of the second trench 105b. The height difference between the first trench 105A and the second trench 105B is induced as the isolation layer 102 is recessed on the bottom of the trench 105. The second trench 105B includes a recess region R which has the bottom surface B2 lower than the bottom surface B1 of the first trench 105A. Due to the step portion formed between the first trench 105A and the second trench 105B, the fin region 106 is formed in the active region 104 under the first trench 105A.

The fin region 106 is formed on the bottom of the trench 105, and the sidewalls of the fin region 106 are exposed by the recess region R. The fin region 106 serves as a portion where a channel is to be formed. The fin region 106 is referred to as a saddle fin. By forming the fin region 106, a channel width may be increased and the electrical characteristics may be improved. The lower portion of the fin region 106 is buried by a recessed isolation layer 102F.

A gate dielectric layer 107 is formed on the top surface and the sidewalls of the fin region 106 and the bottom surface and the sidewalls of the trench 105. The gate dielectric layer 107 may include at least one selected among a silicon oxide, a silicon nitride, a silicon oxynitride and a high-k material. The high-k material may have a dielectric constant higher than the dielectric constants of a silicon oxide and a silicon nitride.

The buried gate electrode 108 is formed in the trench 105. The buried gate electrode 108 includes the first work function layer 109F, the second work function layer 109T, a third work function layer 110, and a low resistance layer 111. The low resistance layer 111 is partially filled in the trench 105. The third work function layer 110 is positioned between the low resistance layer 111 and the gate dielectric layer 107. The first work function layer 109F is positioned on the sidewalls of the fin region 106. The second work function layer 109T is positioned on the sidewalls of the trench 105. The third work function layer 110 covers a top portion of the fin region 106. Further, the third work function layer 110 covers the first work function layer 109F and the second work function layer 109T. The third work function layer 110 is positioned between the low resistance layer 111 and the second work function layer 109T, and is positioned between the low resistance layer 111 and the first work function layer 109F. The third work function layer 110 has a shape which covers both the sidewalls and the top portion of the fin region 106. The low resistance layer 111 is formed in the trench 105 while filling the recess region R. The cross-sectional area of the buried gate electrode 108 is wider in the isolation layer 102 than in the active region 104. The sidewalls of the fin region 106 are influenced by the low work function of the first work function layer 109F. The top surface of the fin region 106 is influenced by the high work function of the third work function layer 110. The heights of the top surfaces of the second work function layer 109T, the third work function layer 110 and the low resistance layer 111 may be the same.

A capping layer 112 is gap-filled on the buried gate electrode 108. The capping layer 112 plays the role of protecting the buried gate electrode 108. The capping layer 112 includes a dielectric material. The capping layer 112 may include a silicon nitride.

The first impurity region 113 and the second impurity region 114 are formed in the active region 104. Each of the first impurity region 113 and the second impurity region 114 is doped with a conductivity type impurity. For example, the conductivity type impurity may include phosphorus (P) or boron (B). The first impurity region 113 and the second impurity region 114 are formed in the active region 104 on both sides of the trench 105. The first impurity region 113 and the second impurity region 114 respectively correspond to a source region and a drain region. The bottom surfaces of the first impurity region 113 and the second Impurity region 114 may be positioned at a predetermined depth from the top surface of the active region 104. The first impurity region 113 and the second impurity region 114 may define the sidewalls of the trench 105. The bottom surfaces of the first impurity region 113 and the second impurity region 114 may be higher than the bottom surface of the trench 105.

The buried gate electrode 108 will be described below in detail.

The first work function layer 109F and the second work function layer 109T may be formed of the same work function material. The first work function layer 109F and the second work function layer 109T may be continuously connected. The third work function layer 110 may be formed of a different work function material from the first work function layer 109F and the second work function layer 109T. The third work function layer 110 may have a higher work function than the first work function layer 109F and the second work function layer 109T. The third work function layer 110 includes a high work function material. The first work function layer 109F and the second work function layer 109T include a low work function material. The high work function material has a work function higher than the mid-gap work function of silicon. The low work function material has a work function lower than the mid-gap work function of silicon. The high work function material has a work function higher than approximately 4.5 eV. The low work function material has a work function lower than approximately 4.5 eV. The first work function layer 109F and the second work function layer 109T include a polysilicon. The first work function layer 109F and the second work function layer 109T may include an N-type polysilicon. The N-type polysilicon is introduced with an N-type impurity such as phosphorus or arsenic. The first work function layer 109F overlaps with the sidewalls of the fin region 106, and does not overlap with the first impurity region 113 and the second impurity region 114. The second work function layer 109T partially overlaps with the first impurity region 113 and the second impurity region 114. Since the second work function layer 109T has a low work function, it may be possible to prevent gate-induced drain leakage (GIDL) from occurring in the first impurity region 113 and the second impurity region 114 by the second work function layer 109T. A threshold voltage is controlled by the high work function of the third work function layer 110. For example, the channel dose of the fin region 106 may be decreased by the high work function of the third work function layer 110.

The low resistance layer 111 includes a material which has a specific resistance lower than the first work function layer 109F, the second work function layer 109T and the third work function layer 110. The resistance of the buried gate electrode 108 is decreased by the low resistance layer 111. The low resistance layer 111 includes a low resistance metal-containing material. The low resistance layer 111 may include tungsten. The low resistance layer 111 and the third work function layer 110 include a metal-containing material, and the first work function layer 109F and the second work function layer 109T include a non-metal material. Therefore, to decrease the resistance of the buried gate electrode 108, the first work function layer 109F and the second work function layer 109T are formed to a thin thickness. The first work function layer 109F and the second work function layer 109T may be referred to as liner layers.

The third work function layer 110 may perform the function of a barrier layer which prevents the reaction of the first and second work function layers 109F and 109T, and the low resistance layer 111. The third work function layer 110 includes a metal-containing material which has a specific resistance lower than the first and second work function layers 109F and 109T. The third work function layer 110 may include a titanium-containing material. For example, the third work function layer 110 may include a titanium nitride. The reaction of the second work function layer 109T and the low resistance layer 111 may be suppressed by the third work function layer 110. Furthermore, the reaction of the first work function layer 109F and the low resistance layer 111 may be suppressed by the third work function layer 110. Accordingly, leakage current may be reduced.

The transistor 100 is referred to as a buried gate type fin channel transistor. The channel of the transistor 100 may be defined along the trench 105 and the fin region 106 between the first impurity region 113 and the second Impurity region 114. The buried gate electrode 108 then becomes a dual work function buried gate (BG) electrode. The dual work function buried gate electrode includes the first work function layer 109F and the second work function layer 109T, which have a low work function, and the third work function layer 110 which has a high work function.

According to the above-described embodiment, the low resistance of the buried gate electrode 108 is secured by the low resistance layer 111. Channel dose may be decreased by the high work function of the third work function layer 110. Gate-induced drain leakage (GIDL) may be improved by the low work function of the second work function layer 109T. An abnormal reaction between the first and second work function layers 109F and 109T and the low resistance layer 111 may be prevented by the third work function layer 110. Accordingly, the work function of the first and second work function layers 109F and 109T may be decreased.

A method for fabricating the transistor in accordance with the embodiment of the present invention will be described below. FIGS. 3A to 3G are cross-sectional views taken along the line A-A' of FIG. 1, illustrating fabrication processes. FIGS. 4A to 4G are cross-sectional views taken along the line B-B' of FIG. 1, illustrating fabrication processes.

Figure 3A:
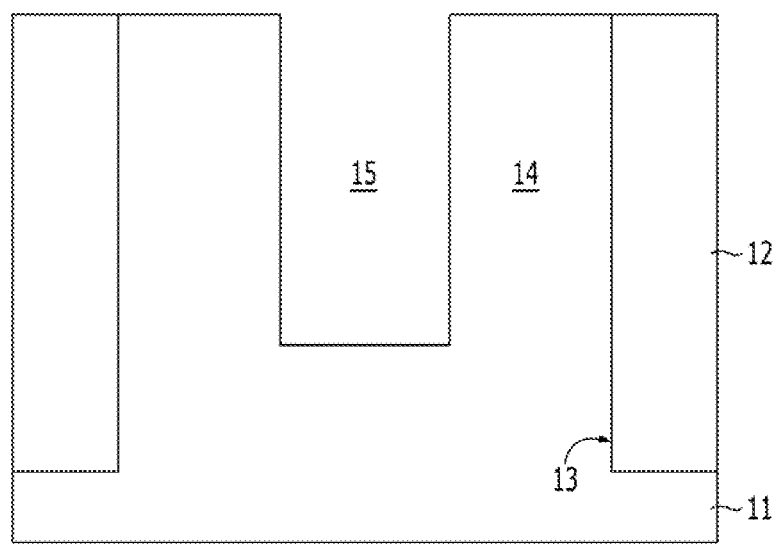
FIGS. 3A to 3G are cross-sectional views taken along the line A-A' of FIG. 1, illustrating fabrication processes.
Figure 4A:
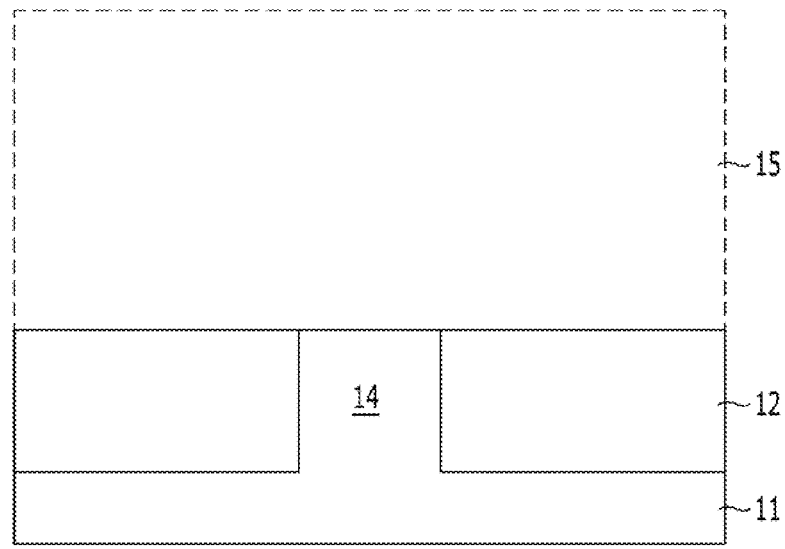
FIGS. 4A to 4G are cross-sectional views taken along the line B-B' of FIG. 1, illustrating fabrication processes.

As shown in FIGS. 3A and 4A, an isolation layer 12 is formed in a substrate 11. An active region 14 is defined by the isolation layer 12. The isolation layer 12 may be formed through an STI (shallow trench isolation) process. For example, after forming a pad layer (not shown) on the substrate 11, the pad layer and the substrate 11 are etched using an isolation mask (not shown). In this way, an isolation trench 13 is defined. The isolation trench 13 is filled with a dielectric material, and accordingly, the isolation layer 12 is formed. As the isolation layer 12, a wall oxide, a liner and a gap-fill dielectric may be sequentially formed. The liner may be formed by stacking a silicon nitride and a silicon oxide. The silicon nitride may include $Si_3N_4$, and the silicon oxide may include $SiO_2$. The gap-fill dielectric may include a spin-on dielectric (SOD). In another embodiment of the present invention, a silicon nitride may be used as the gap-fill dielectric in the isolation layer 12.

A trench 15 is defined in the substrate 11. The trench 15 may be defined as a line type which extends across the active region 14 and the isolation layer 12. The trench 15 may be defined by forming a mask pattern (not shown) on the substrate 11 and performing an etching process using the mask pattern as an etch mask. The trench 15 may be defined to be shallower than the isolation trench 13.

Figure 3B:
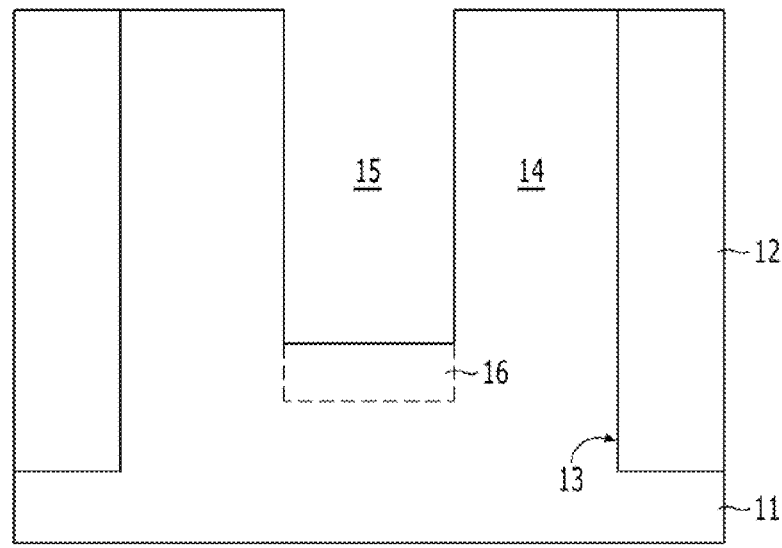
Figure 4B:
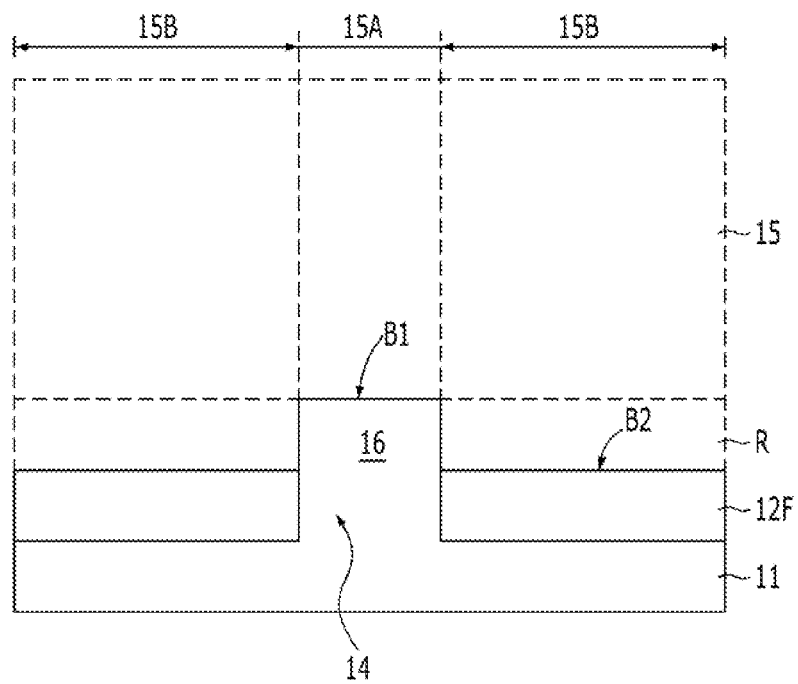

As shown in FIGS. 3B and 4B, the isolation layer 12 is recessed by a predetermined depth on the bottom of the trench 15 so that a recess region R is defined and a fin region 16 is formed by the recess region R. The lower portion of the fin region 16 is buried by a recessed isolation layer 12F. The trench 15 includes a first trench 15A and a second trench 15B. The first trench 15A is defined in the active region 14. The second trench 15B is defined in the isolation layer 12. The first trench 15A and the second trench 15B may communicate with each other. In the trench 15, the first trench 15A and the second trench 15B may have bottom surfaces B1 and B2 which are positioned at different levels. For example, the bottom surface B1 of the first trench 15A may be positioned at a higher level than the bottom surface B2 of the second trench 15B. The height difference between the first trench 15A and the second trench 15B is induced as the isolation layer 12 is recessed on the bottom of the trench 15. The second trench 15B includes the recess region R which has a bottom surface B2 lower than the bottom surface B1 of the first trench 15A. Due to the step portion formed between the first trench 15A and the second trench 15B, the fin region 16 is formed in the active region 14.

Figure 3C:
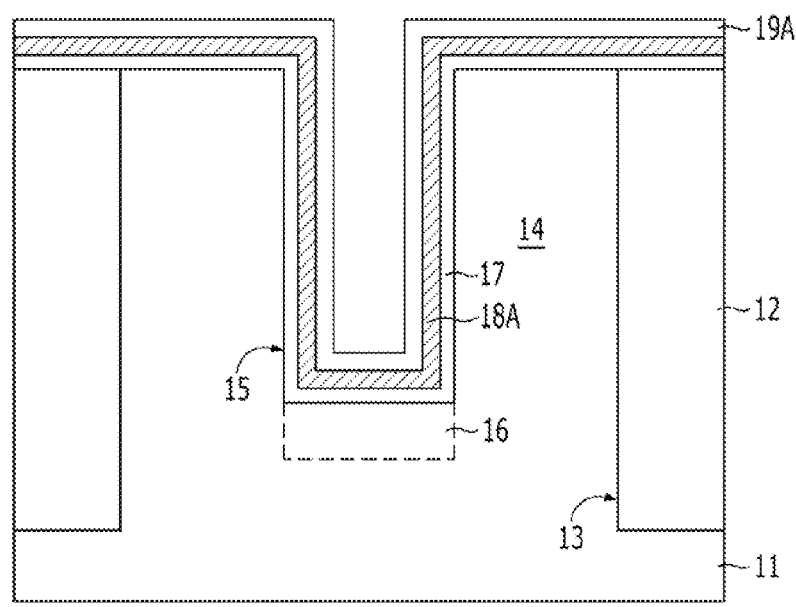
Figure 4C:
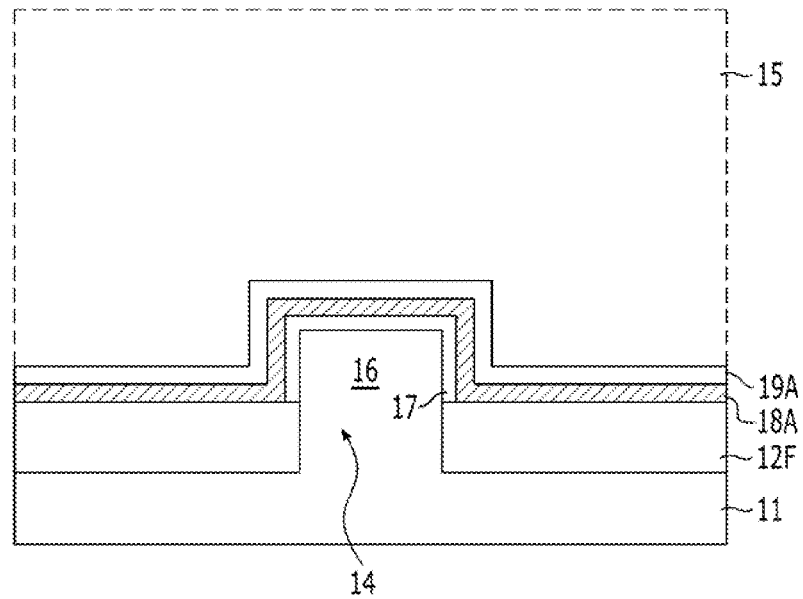

As shown in FIGS. 3C and 4C, a gate dielectric layer 17 is formed on the surface of the trench 15. The gate dielectric layer 17 may be formed through a thermal oxidation process. In another embodiment of the present invention, the gate dielectric layer 17 may be formed by chemical vapor deposition (CVD) or atomic layer deposition (ALD). The gate dielectric layer 17 may include at least one selected among a high-k material, an oxide, a nitride and an oxynitride. The high-k material may have a dielectric constant higher than the dielectric constants of a silicon oxide and a silicon nitride. For example, the high-k material may be at least one selected among metal oxides such as a hafnium oxide and an aluminum oxide.

A first conductive layer 18A is formed on the gate dielectric layer 17. The first conductive layer 18A lines the surface of the gate dielectric layer 17. The first conductive layer 18A includes a first work function layer. The first work function layer has a work function lower than the mid-gap work function of silicon. The first work function layer is referred to as a "low work function layer". The first conductive layer 18A is formed of a silicon-containing material. The first conductive layer 18A is introduced with an N-type impurity to have a low work function. The first conductive layer 18A includes an N-type polysilicon. The N-type polysilicon is introduced with phosphorus or arsenic. The polysilicon introduced with phosphorus may be formed by flowing in situ phosphorus or a phosphorus compound when depositing a polysilicon. In another embodiment of the present invention, after depositing an undoped polysilicon, a doping process of phosphorus or a phosphorus compound may be performed. The doping process may include implantation, plasma doping or another doping technology. The first conductive layer 18A also lines the sidewalls of the fin region 16.

A sacrificial layer 19A is formed on the first conductive layer 18A. The sacrificial layer 19A lines the surface of the first conductive layer 18A. The sacrificial layer 19A is used as an etch barrier in the etching process of the first conductive layer 18A. The sacrificial layer 19A may include an oxide.

Figure 3D:
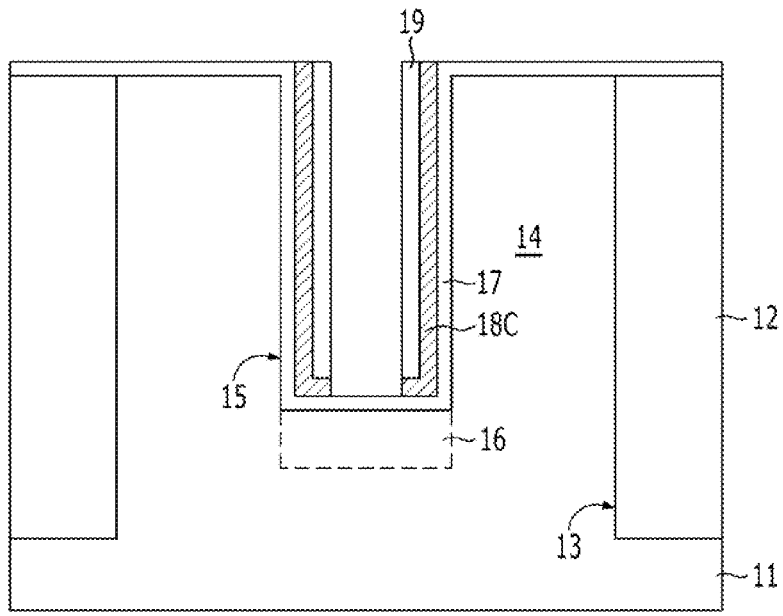
Figure 4D:
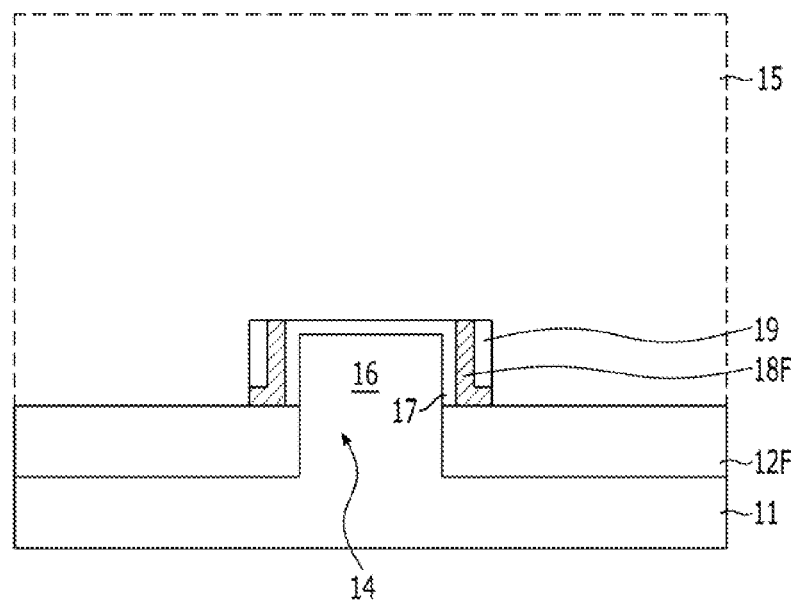

As shown in FIGS. 3D and 4D, sacrificial spacers 19 are formed. The sacrificial spacers 19 may be formed by the etch-back process of the sacrificial layer 19A shown in FIGS. 3C and 4C. The sacrificial spacers 19 are positioned on the sidewalls of the trench 15 and the fin region 16.

The first conductive layer 18A is selectively etched. At this time, the sacrificial spacers 19 serve as an etch barrier. To etch the first conductive layer 18A, an etch-back process may be performed.

Accordingly, a first work function layer 18F is formed on the sidewalls of the fin region 16, and a preliminary second work function layer 18C is formed on the sidewalls of the trench 15. The first work function layer 18F and the preliminary second work function layer 18C may be connected, and expose at least the top portion of the fin region 16.

Figure 3E:
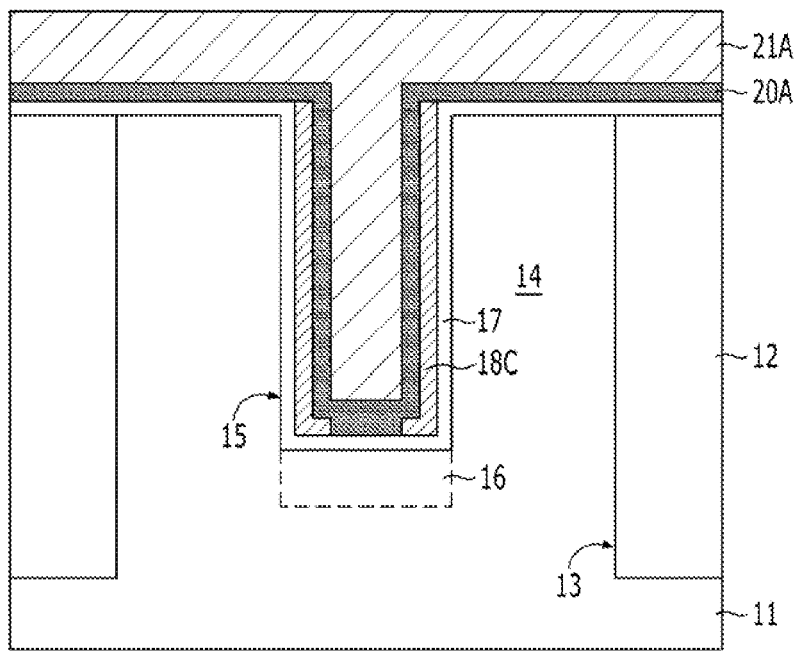
Figure 4E:
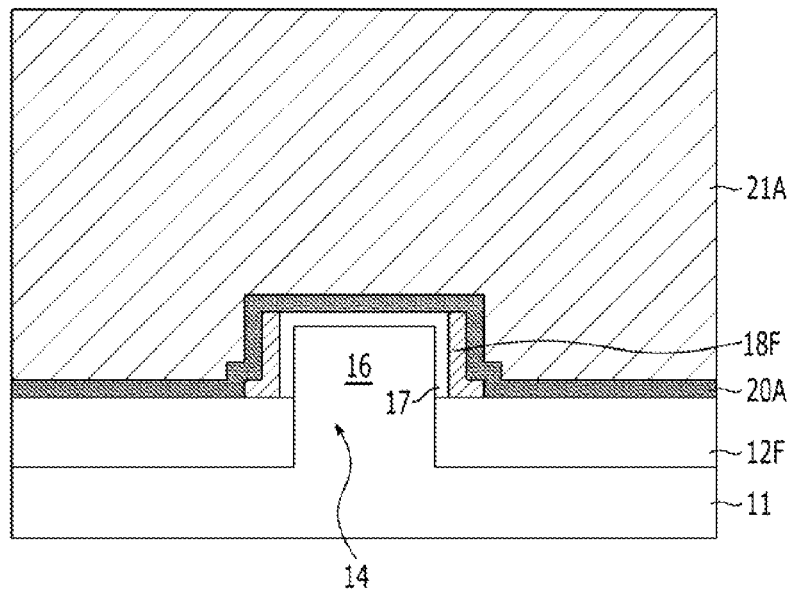

As shown in FIGS. 3E and 4E, the sacrificial spacers 19 are removed.

After removing the sacrificial spacers 19, a second conductive layer 20A is formed. The second conductive layer 20A and the first conductive layer 18A, shown in FIGS. 3C and 4C, may be different materials. The second conductive layer 20A includes a material which has a work function higher than the first work function layer 18F and the preliminary second work function layer 18C. That is, the second conductive layer 20A may include a high work function material. The second conductive layer 20A may be formed of a metal-containing material. The second conductive layer 20A may include a metal nitride. For example, the second conductive layer 20A may include a titanium nitride.

A third conductive layer 21A is formed on the second conductive layer 20A. The third conductive layer 21A fills the trench 15. The third conductive layer 21A includes a low resistance material. The third conductive layer 21A includes a low resistance metal-containing material. The third conductive layer 21A may include tungsten.

Figure 3F:
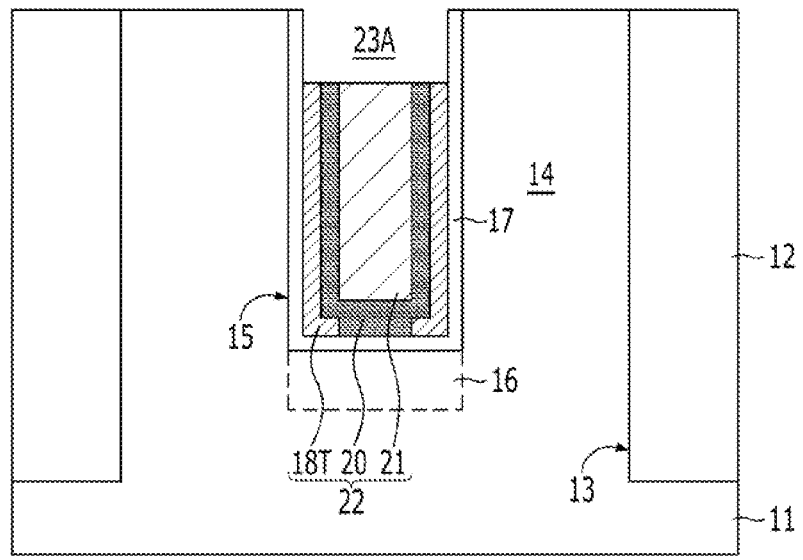
Figure 4F:
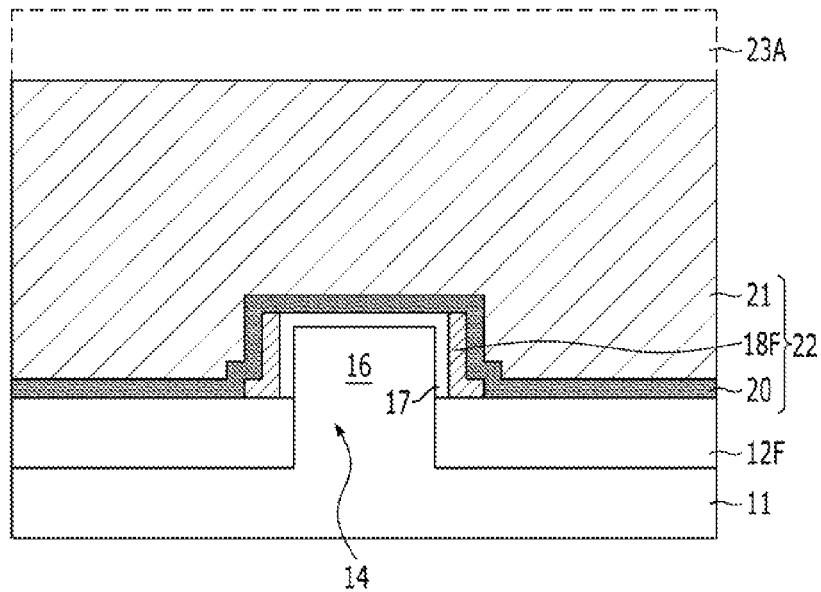

As shown in FIGS. 3F and 4F, a recessing process is performed in such a way that the preliminary second work function layer 18C shown in FIGS. 3E and 4E, the second conductive layer 20A and the third conductive layer 21A remain in the trench 15. The recessing process may be performed by an etch-back or other process. Accordingly, a second work function layer 18T, a third work function layer 20, and a low resistance layer 21 are formed. The second work function layer 18T is formed by the etch-back process of the preliminary second work function layer 18C. The third work function layer 20 is formed by the etch-back process of the second conductive layer 20A shown in FIGS. 3E and 4E. The low resistance layer 21 is formed by the etch-back process of the third conductive layer 21A shown in FIGS. 3E and 4E. A planarization process may be performed before an etch-back process. The first work function layer 18F is not exposed to the recessing process.

By the recessing process described above, a buried gate electrode 22 is formed. The buried gate electrode 22 includes the first work function layer 18F, the second work function layer 18T, the third work function layer 20, and the low resistance layer 21. The first work function layer 18F and the second work function layer 18T include a low work function material, and the third work function layer 20 has a high work function material. The third work function layer 20 prevents the reaction between the low resistance layer 21 and the first and second work function layers 18F and 18T. The first work function layer 18F is formed on the sidewalls of the fin region 16. The second work function layer 18T is formed on the sidewalls of the trench 15 and the top portion of the fin region 16.

The top end of the buried gate electrode 22 is positioned lower than the top surface of the substrate 11, and thus a recessed gap region 23A is defined.

Figure 3G:
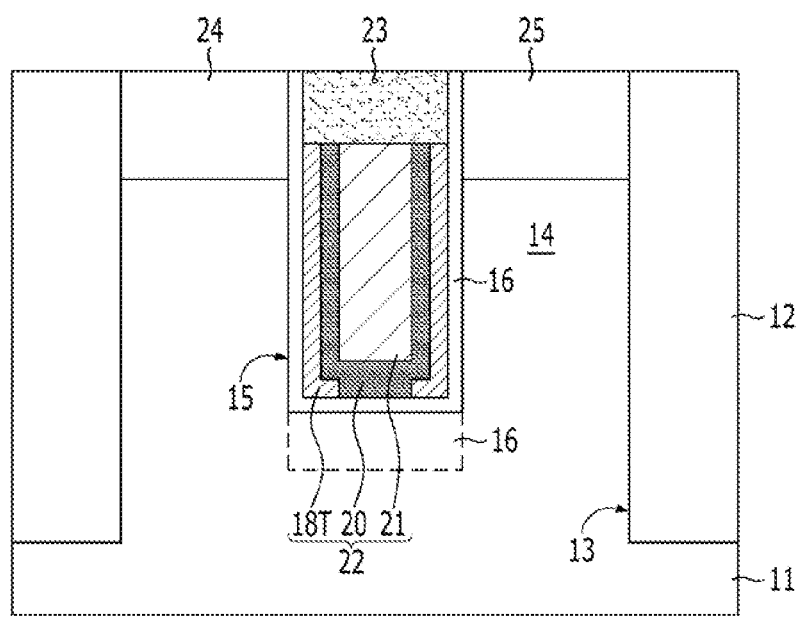
Figure 4G:
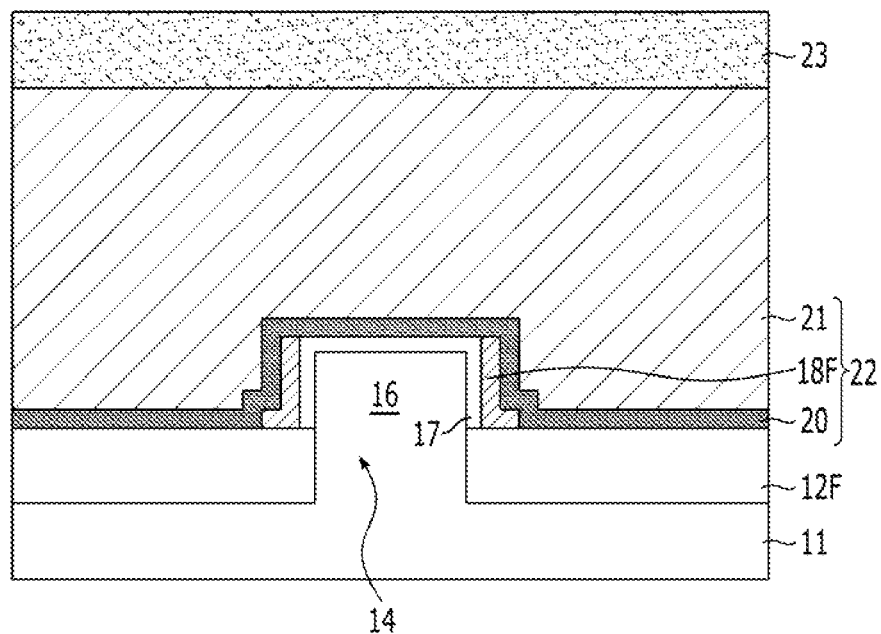

As shown in FIGS. 3G and 4G, a capping layer 23 is formed on the buried gate electrode 22. The capping layer 23 includes a dielectric material. The recessed gap region 23A shown in FIGS. 3F and 4F is filled with the capping layer 23. The capping layer 23 may include a silicon nitride. Subsequently, planarization of the capping layer 23 may be performed such that the top surface of the substrate 11 is exposed.

After forming the capping layer 23, a doping process of an impurity is performed by implantation or another doping technology so that a first impurity region 24 and a second impurity region 25 are formed in the substrate 11. When performing the doping process of an impurity, the capping layer 23 is used as a barrier. The first impurity region 24 and the second impurity region 25 respectively become a source region and a drain region.

The bottom surfaces of the first impurity region 24 and the second impurity region 25 may have a depth that overlaps with the upper portion of the buried gate electrode 22. Accordingly, the second work function layer 18T and the first and second impurity regions 24 and 25 overlap with each other.

Figure 5:
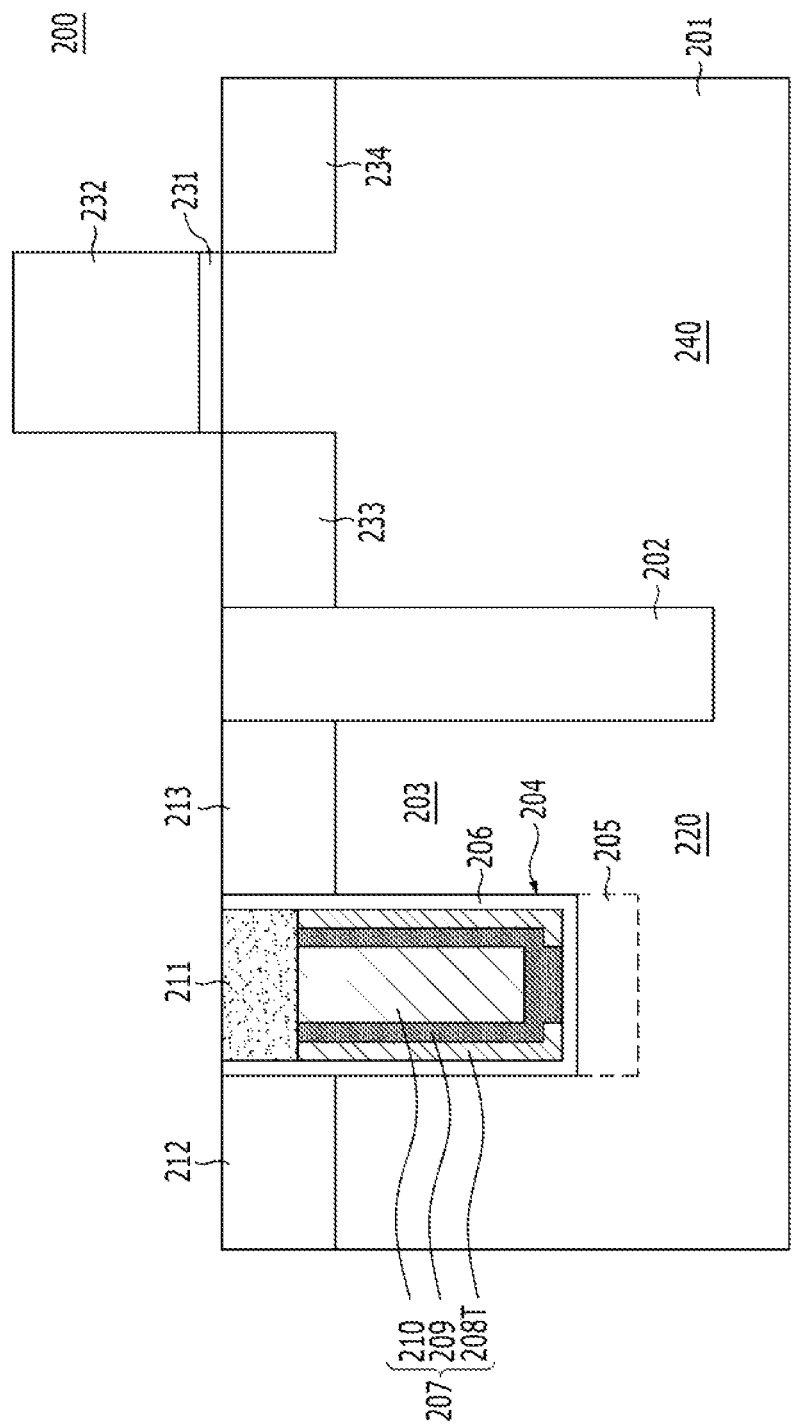
FIG. 5 is a view illustrating an exemplary semiconductor device including a transistor in accordance with an embodiment of the present invention.

FIG. 5 is a view Illustrating an exemplary semiconductor device including a transistor in accordance with the embodiment of the present invention.

Referring to FIG. 5, a semiconductor device 200 includes a first transistor 220 and a second transistor 240. The first transistor 220 and the second transistor 240 are formed in a substrate 201 and are isolated from each other by an isolation layer 202.

The first transistor 220 includes a buried gate electrode 207, a first source region 212, and a first drain region 213. The buried gate electrode 207 is formed in a trench 204. The trench 204 has a shape which extends across the isolation layer 202 and an active region 203. A fin region 205 is formed in the active region 203 under the trench 204. A first gate dielectric layer 206 is formed on the surfaces of the fin region 205 and the trench 204. The buried gate electrode 207 includes a first work function layer (not shown), a second work function layer 208T, a third work function layer 209, and a low resistance layer 210. The first work function layer is positioned on the sidewalls of the fin region 205 and the second work function layer 208T is positioned on the sidewalls of the trench 204. For the first work function layer of the buried gate electrode 207, reference may be made to FIG. 2B. The second work function layer 208T overlaps with the first source region 212 and the first drain region 213.

The second transistor 240 includes a planar gate electrode 232, a second source region 233, and a second drain region 234. A second gate dielectric layer 231 is formed under the planar gate electrode 232. The planar gate electrode 232 may include a polysilicon, a metal, a metal nitride, a metal compound, or a combination thereof. The second gate dielectric layer 231 may include at least one selected from a silicon oxide, a silicon nitride, a silicon oxynitride and a high-k material. The high-k material may include a hafnium-based material. An interface layer and a high-k material may be stacked to form the second gate dielectric layer 231. The interface layer may include a silicon oxide, a silicon nitride or a silicon oxynitride.

In the semiconductor device 200, the first transistor 220 having the buried gate electrode 207 and the second transistor 240 having the planar gate electrode 232 are integrated in one substrate 201. After forming the first transistor 220, the second transistor 240 may be formed.

In the semiconductor device 200, both the first transistor 220 and the second transistor 240 may be NMOSFETs.

The semiconductor device 200 may be a CMOSFET. For example, the first transistor 220 may be an NMOSFET and the second transistor 240 may be a PMOSFET. In the case of the PMOSFET, as the planar gate electrode 232, a P-type work function material may be selected to have a work function appropriate for a PMOSFET.

The first transistor 220 is referred to as a buried gate type transistor and the second transistor 240 is referred to as a planar gate type transistor. The planar gate type transistor is an example of a non-buried gate type transistor. The non-buried gate type transistor may further include a fin type transistor which is generally known in the art. The fin type transistor is different from a buried gate type fin channel transistor. In the fin type transistor, a fin region is formed by recessing an isolation layer so that an active region protrudes, without defining a trench.

In the semiconductor device 200, the first transistor 220 may be the transistor of a memory cell and the second transistor 240 may be the transistor of a peripheral circuit region.

As a result, since the buried gate electrode 207 including the third work function layer 209 having a high work function and the second work function layer 208T having a low work function are formed in such a way that the second work function layer 208T overlaps with the first source region 212 and the first drain region 213, not only may gate resistance be decreased, but also gate-induced drain leakage (GIDL) may be reduced.

Accordingly, the performance of the semiconductor device 200 may be improved.

Figure 6:
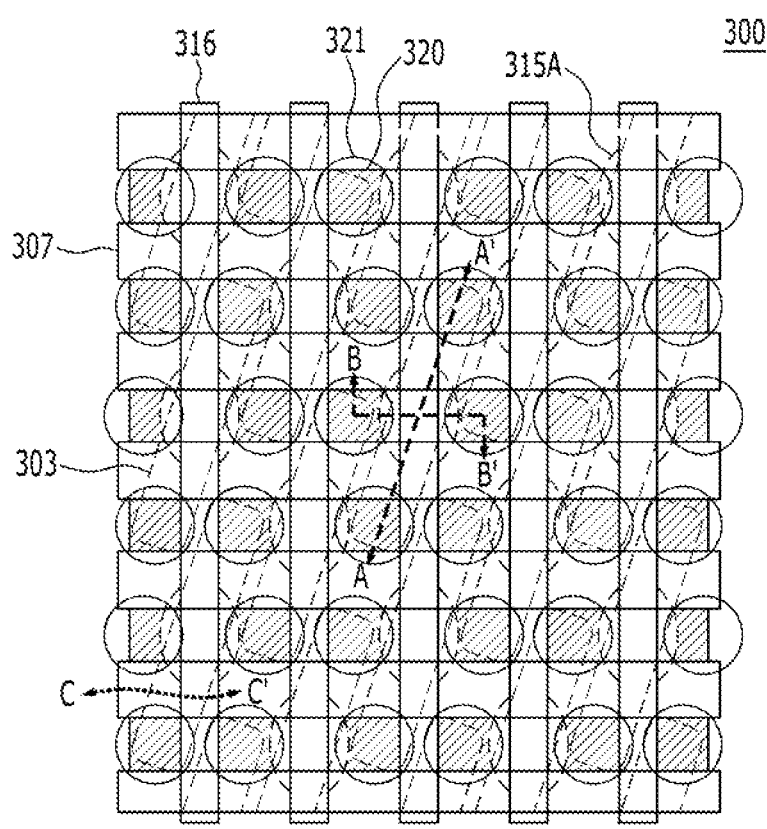
FIG. 6 is a plan view illustrating another exemplary semiconductor device including a transistor in accordance with an embodiment of the present invention.
Figure 7A:
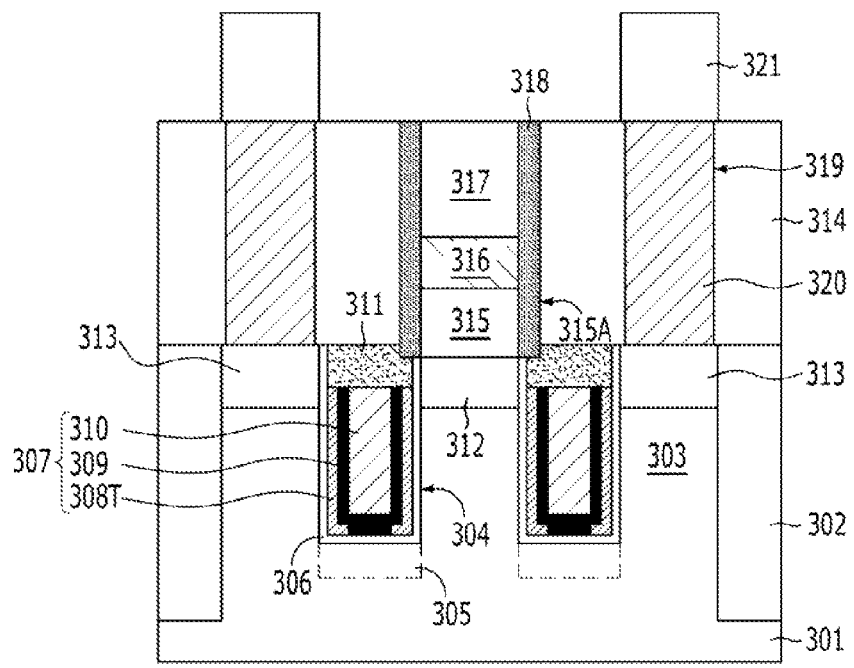
FIG. 7A is a cross-sectional view taken along the line A-A' of FIG. 6.
Figure 7B:
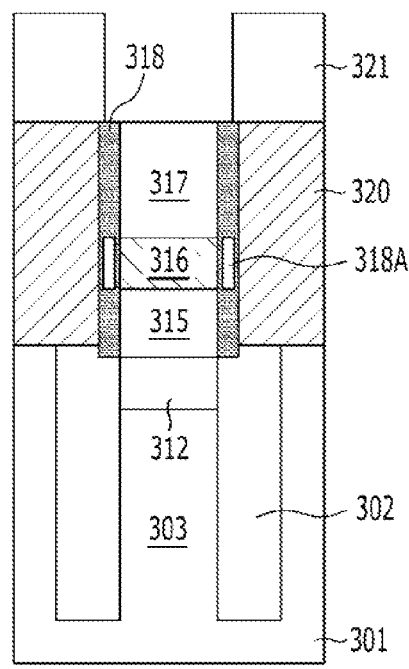
FIG. 7B is a cross-sectional view taken along the line B-B' of FIG. 6.
Figure 7C:
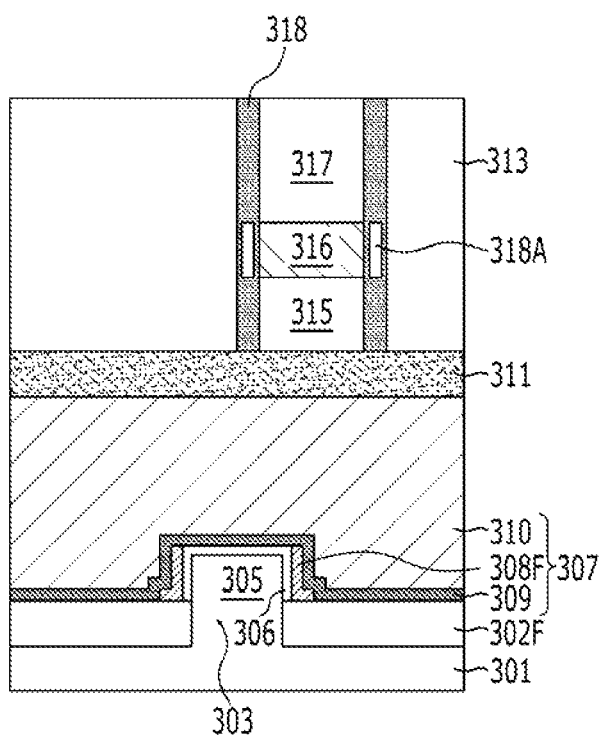
FIG. 7C is a cross-sectional view taken along the line C-C' of FIG. 6.

FIG. 6 is a plan view illustrating another exemplary semiconductor device including the buried gate type transistor in accordance with an embodiment of the present invention. FIG. 6 is a plan view illustrating a memory cell array of a memory device. FIG. 7A is a cross-sectional view taken along the line A-A' of FIG. 6. FIG. 7B is a cross-sectional view taken along the line B-B' of FIG. 6. FIG. 7C is a cross-sectional view taken along the line C-C' of FIG. 6.

Referring to FIGS. 6, 7A, 7B and 7C, a memory cell array 300 includes a plurality of buried word lines 307, a plurality of bit lines 316 which extend in a direction crossing with the buried word lines 307, and a plurality of memory elements 321.

The memory cell array 300 will be described below in detail.

An isolation layer 302 is formed in a substrate 301. A plurality of active regions 303 are defined by the isolation layer 302. Gate trenches 304 are defined to extend across the active regions 303. Fin regions 305 are formed under the gate trenches 304. A gate dielectric layer 306 is formed on the surfaces of the fin regions 305 and the gate trenches 304. The lower portions of the fin regions 305 are buried by a recessed isolation layer 302F.

The buried word lines 307 are formed on the gate dielectric layer 306 to partially fill the gate trenches 304. Each of the buried word lines 307 includes a first work function layer 308F, a second work function layer 308T, a third work function layer 309, and a low resistance layer 310. The buried word line 307 has the same configuration as the buried gate electrode 108 shown in FIGS. 2A and 2B. The first work function layer 308F is formed on the sidewalls of the fin region 305. The second work function layer 308T is formed on the sidewalls of the gate trench 304. The third work function layer 309 is formed on the top portion of the fin region 305 and the sidewalls of the gate trench 304.

A capping layer 311 is formed on the buried word line 307. A first impurity region 312 and a second impurity region 313 are formed in the substrate 301 on both sides of the buried word line 307.

A bit line structure which is electrically connected with the first impurity region 312 may be formed. The bit line structure includes a bit line 316 and a bit line hard mask layer 317. The bit line structure may further include a first contact plug 315 which is interposed between the bit line 316 and the first impurity region 312. Spacers 318 are formed on the sidewalls of the bit line structure. An isolation layer 314 is formed on the substrate 301. The first contact plug 315 may be formed in a first contact hole 315A. The first contact plug 315 is electrically connected with the first impurity region 312. The diameter of the first contact hole 315A may be larger than the line width of the bit line 316. The line widths of the first contact plug 315 and the bit line 316 may be the same as each other. Therefore, gaps are defined between the first contact plug 315 and the sidewalls of the first contact hole 315A, and portions of the spacers 318 extend to be filled in the gaps. The surface of the first impurity region 312 may be recessed to increase the contact area between the first contact plug 315 and the first impurity region 312. The bit line 316 may extend in a direction crossing the buried word line 307. The bit line 316 may include at least one selected among a polysilicon, a metal silicide, a metal nitride and a metal. The bit line hard mask layer 317 may include a silicon oxide or a silicon nitride. The first contact plug 315 may include at least one selected among a polysilicon, a metal silicide, a metal nitride and a metal.

The spacers 318 include a dielectric material. The spacers 318 may include a silicon oxide, a silicon nitride or a combination of a silicon oxide and a silicon nitride. The spacers 318 may have a multi-spacer structure. For example, the spacers 318 may have a NON structure of a silicon nitride/a silicon oxide/a silicon nitride. The spacers 318 may also have an air-gap embedded multi-spacer structure. Air gaps 318A may be defined between the bit line 316 and second contact plugs 320. The spacers 318 may have an N-Air-N structure in which air gaps 318A are positioned between silicon nitrides. The air gaps 318A may be positioned between the bit line 316 and the second contact plugs 320. Further, the air gaps 318A may extend to be positioned between the first contact plug 315 and the second contact plugs 320. The parasitic capacitance between the bit line 316 and the second contact plugs 320 is decreased by the presence of the air gaps 318A. Since the parasitic capacitance is decreased, sensing margin may be improved.

The memory element 321 may be formed on the second impurity region 313. The second contact plug 320 may be formed between the memory element 321 and the second impurity region 313. A second contact hole 319 is defined to pass through the isolation layer 314 and each second contact plug 320 may be formed in the second contact hole 319. The second contact plug 320 is electrically connected with the second impurity region 313. The second contact plug 320 may include at least one selected among a polysilicon, a metal, a metal silicide and a metal nitride. For example, the second contact plug 320 may include a plug structure in which a polysilicon, a metal silicide and a metal are stacked.

The isolation layer 314 may be a single layer or multiple layers. The isolation layer 314 may include at least one selected among a silicon oxide, a silicon nitride and a silicon oxynitride. The isolation layer 314 may be formed through a damascene process or the like. The isolation layer 314 serves to isolate adjacent second contact plugs 320 from each other. In another embodiment of the present invention, contact spacers which surround the sidewalls of the second contact plugs 320 may be additionally formed. The contact spacers may have an air-gap embedded multi-spacer structure. Additionally, the spacers 318 may not be defined with the air gaps 318A. The top surfaces of the isolation layer 314 and the bit line structure may be positioned at the same level.

In another embodiment of the present invention, third contact plugs (not shown) may be additionally formed on the second contact plugs 320. Each of the third contact plugs may have a shape which overlaps with the bit line structure and the second contact plug 320. The third contact plugs may include a metal material.

The memory element 321 which is electrically connected with the second contact plug 320 may be formed on the second contact plug 320. The memory element 321 may be embodied in various forms.

The memory element 321 may be a capacitor. Accordingly, the memory element 321 may include a storage node which contacts the second contact plug 320. The storage node may have a cylinder shape or a pillar shape. A capacitor dielectric layer may be formed on the surface of the storage node. The capacitor dielectric layer may include at least one selected among a zirconium oxide, an aluminum oxide and a hafnium oxide. For example, the capacitor dielectric layer may have a ZAZ structure in which a first zirconium oxide, an aluminum oxide and a second zirconium oxide are stacked. A plate node may be formed on the capacitor dielectric layer. Each of the storage node and the plate node may include a metal-containing material.

The memory element 321 may include a variable resistor. The variable resistor may include a phase change material. The phase change material may include at least one selected between Te and Se as chalcogenide elements. In another embodiment, the variable resistor may include a transition metal oxide. In still another embodiment, the variable resistor may be a magnetic tunnel junction (MTJ).

As a consequence, since the buried word line 307 including the third work function layer 309 of a high work function, the first work function layer 308F of a low work function and the second work function layer 308T of a low work function are formed in such a way that the second work function layer 308T overlaps with the first impurity region 312 and the second impurity region 313, not only may gate resistance be decreased, but also gate-induced drain leakage (GIDL) may be reduced.

Accordingly, the data retention time may be increased and the refresh characteristics may be improved.

The transistors according to the embodiments of the present invention may be integrated in transistor circuits. Additionally, the transistors according to the embodiments of the present invention may be applied to integrated circuits including transistors for various purposes. For example, the transistors according to the embodiments of the present invention may be applied to integrated circuits including an IGFET (insulated gate FET), an HEMT (high electron mobility transistor), a power transistor, a TFT (thin film transistor), and so forth.

The transistors and the integrated circuits according to the embodiments of the present invention may be built in an electronic device. The electronic device may include a memory device and a non-memory device. The memory devices include an SRAM, a DRAM, a FLASH, an MRAM, a ReRAM, an STTRAM, a FeRAM, and the like. The non-memory devices include a logic circuit. For controlling a memory device, the logic circuit may include a sense amplifier, a decoder, an input/output circuit and so forth. Also, the logic circuit may include various integrated circuits (ICs) other than a memory. For example, the logic circuit may include a microprocessor, an application processor of a mobile device, and so forth. Furthermore, the non-memory device may include a logic gate such as a NAND gate, a driver IC for a display device, a power semiconductor device such as a power management IC (PMIC), and so forth. The electronic device may include a computing system, an image sensor, a camera, a mobile device, a display device, a sensor, a medical instrument, an optoelectronic device, a radio frequency identification (RFID), a photovoltaic cell, a semiconductor device for an automobile, a semiconductor device for a railroad car, a semiconductor device for an aircraft, and so forth.

Hereafter, various application examples including a transistor according to the embodiments of the present invention will be described.

Figure 8A:
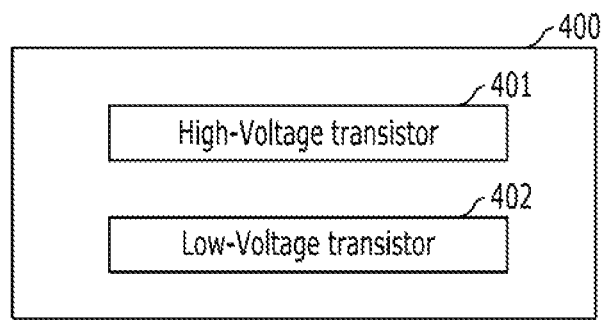
FIGS. 8A to 8C are diagrams illustrating various application examples of an integrated circuit including transistors according to the embodiments of the present invention.
Figure 8B:
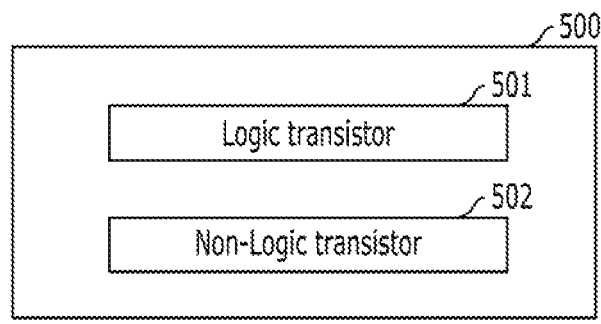
Figure 8C:
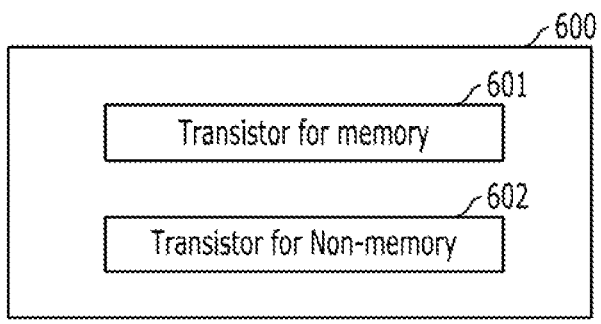

FIGS. 8A to 8C are diagrams illustrating various application examples of an integrated circuit including transistors according to the embodiments of the present invention.

An integrated circuit 400 shown in FIG. 8A includes a plurality of high voltage transistors 401 and a plurality of low voltage transistors 402.

An integrated circuit 500 shown in FIG. 8B includes a plurality of logic transistors 501 and a plurality of non-logic transistors 502.

An integrated circuit 600 shown in FIG. 8C includes transistors 601 for a memory device and transistors 602 for a non-memory device.

The above-described high voltage transistors 401, low voltage transistors 402, logic transistors 501, non-logic transistors 502, transistors 601 for a memory device, and transistors 602 for a non-memory device may include the buried gate type transistor according to the embodiments of the present invention. The buried gate type transistor included in the integrated circuits 400, 500 and 600 includes a buried gate electrode which is formed in a trench including a fin region. The buried gate electrode includes a dual work function buried gate electrode. The buried gate electrode includes a first work function layer, a second work function layer, a third work function layer, and a low resistance layer. The first work function layer is positioned on the sidewalls of the fin region. The second work function layer overlaps with a source region and a drain region, and therefore, improves GIDL.

Therefore, it may be possible to improve the performance of the integrated circuits 400, 500 and 600.

Figure 9:
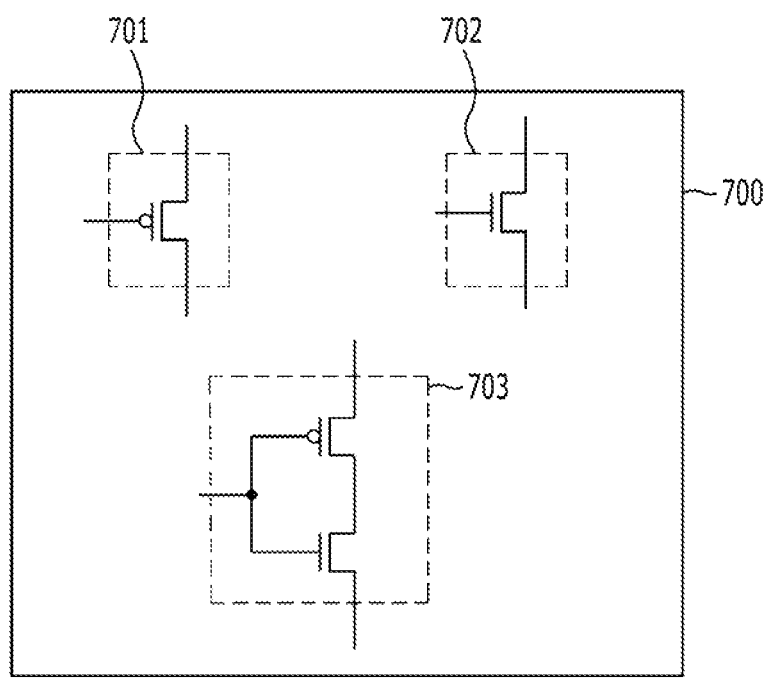
FIG. 9 is a diagram illustrating an electronic device including transistors according to the embodiments of the present invention.

FIG. 9 is a diagram illustrating an electronic device including transistors according to the embodiments of the present invention.

Referring to FIG. 9, an electronic device 700 includes a plurality of transistors. The electronic device 700 may include a plurality of PMOSFETs 701, a plurality of NMOSFETs 702 and a plurality of CMOSFETs 703. At least one of the transistors PMOSFETs 701, the NMOSFETs 702 and the CMOSFETs 703, may include the buried gate type transistors according to the embodiments of the present invention. The buried gate type transistor included in the electronic device 700 includes a buried gate electrode which is formed in a trench including a fin region. The buried gate electrode includes a dual work function buried gate electrode. The buried gate electrode includes a first work function layer, a second work function layer, a third work function layer, and a low resistance layer. The first work function layer is positioned on the sidewalls of the fin region. The second work function layer overlaps with a source region and a drain region, and therefore, improves GIDL. Accordingly, the electronic device 700 may operate at high speed when scaled-down.

As is apparent from the above descriptions, according to the embodiments of the present invention, since a low work function layer is formed on the sidewalls of a trench and the sidewalls of a fin region, gate-induced drain leakage (GIDL) may be reduced.

Also, according to the embodiments of the present invention, since a high work function layer is formed on the fin region, the dose of the fin channel may be decreased.

Although various embodiments have been described for illustrative purposes, it will be apparent to those skilled in the art that various changes and modifications may be made without departing from the spirit and scope of the invention as defined in the following claims.

What is claimed is:

1. A transistor comprising:
a substrate having an active region defined by an isolation layer;
a first trench defined in the active region and a second trench defined in the isolation layer;
a fin region formed under the first trench; and
a buried gate electrode covering sidewalls of the fin region and filling the first and second trenches,
wherein the buried gate electrode includes:
a first work function layer formed on the sidewalls of the fin region;
a second work function layer formed on sidewalls of the first trench and the second trench;
a third work function layer positioned over the fin region and contacting the second work function layer; and
a low resistance layer contacting the third work function layer and partially filling the first and second trenches.

2. The transistor according to claim 1, wherein the third work function layer has a work function higher than the first work function layer and the second work function layer.

3. The transistor according to claim 1, wherein the third work function layer includes a high work function material, and the first work function layer and the second work function layer include a low work function material.

4. The transistor according to claim 1, wherein the first work function layer and the second work function layer include an N-type polysilicon layer.

5. The transistor according to claim 1, wherein the low resistance layer includes a metal-containing material which has a specific resistance lower than the first work function layer and the second work function layer.

6. The transistor according to claim 1, wherein the third work function layer includes a metal nitride, and the low resistance layer includes a low resistance metal-containing layer.

7. The transistor according to claim 1, wherein the second work function layer, the third work function layer and the low resistance layer are positioned at a level lower than a top surface of the substrate.

8. The transistor according to claim 1, further comprising:
a gate dielectric layer between the second work function layer and the first and second trenches.

9. The transistor according to claim 1, further comprising:
a first impurity region and a second impurity region separated by the first trench and formed in the substrate.

10. The transistor according to claim 9, wherein the first and second impurity regions have a depth to overlap with the second work function layer.

* * * * *